United States Patent [19]

Schwabe et al.

[11] 4,143,455

[45] Mar. 13, 1979

[54] METHOD OF PRODUCING A SEMICONDUCTOR COMPONENT

[75] Inventors: Ulrich Schwabe, Munich; Ronald Rathbone, Taufkirchen, both of Fed. Rep. of Germany

[73] Assignee: Siemens Aktiengesellschaft, Berlin & Munich, Fed. Rep. of Germany

[21] Appl. No.: 921,711

[22] Filed: Jul. 3, 1978

Related U.S. Application Data

[63] Continuation of Ser. No. 773,592, Mar. 2, 1977, abandoned.

[30] Foreign Application Priority Data

Mar. 11, 1976 [DE]  Fed. Rep. of Germany ....... 2610208

[51] Int. Cl.² ...................... H01L 21/22; H01L 21/26
[52] U.S. Cl. ...................................... 29/571; 148/1.5; 148/187
[58] Field of Search .................... 148/1.5, 187; 29/571

[56] References Cited

U.S. PATENT DOCUMENTS

| 3,909,318 | 9/1975 | LeCan et al. | 148/175 |
|---|---|---|---|
| 3,933,540 | 1/1976 | Kondo et al. | 148/175 |
| 3,962,717 | 6/1976 | O'Brien | 148/175 X |
| 3,963,524 | 6/1976 | Graul et al. | 148/1.5 |
| 3,977,925 | 8/1975 | Schwabe | 156/17 X |
| 4,008,107 | 2/1977 | Hayasaka et al. | 148/175 |
| 4,014,714 | 3/1977 | Murrmann et al. | 148/1.5 |

Primary Examiner—G. Ozaki
Attorney, Agent, or Firm—Hill, Gross, Simpson, Van Santen, Steadman, Chiara & Simpson

[57] ABSTRACT

Semiconductor components, as for LSI-circuits are produced in such a manner that epitaxial layers as well as buried layers are dispensed with while an increased manufacturing yield and an increased structural packing density is achieved via an oxide insulating technique. The process involves applying and structuring a first insulating layer, such as composed of $Si_3N_4$, onto a semiconductor substrate having a first zone of one conductivity type therein, etching insulating grooves into the substrate areas not covered with the first insulating layer and filling such grooves with a second insulating layer, such as composed of $SiO_2$, which is thicker than the first insulating layer, and then emplacing the various semiconductor structures at select surface areas between spaced-apart areas of the second insulating layer so as to complete the semiconductor structure.

9 Claims, 5 Drawing Figures

METHOD OF PRODUCING A SEMICONDUCTOR COMPONENT

This is a continuation of application Ser. No. 773,592, filed Mar. 2, 1977 now abandoned.

BACKGROUND OF THE INVENTION

1. Field of the Invention

The invention relates to semiconductor components and somewhat more particularly to a method of producing semiconductor components, such as transistors, diodes, Schottky diodes, resistors in integrated circuits, etc.

2. Prior Art

In the production of integrated circuits, particularly LSI (large scale integration) circuits, a constant desire is to achieve as high a structural packing density as possible while maintaining the production procedure as simple as possible in order to increase the manufacturing yield. Heretofore, suggestions have been made to dispense with buried layers and epitaxial layers which are typically provided on semiconductor substrates, so as to achieve a greater packing density. Since adjacent semiconductor components or elements in an integrated circuit must be electrically insulated from one another in order to prevent one component from undesirably interfering with another, so-called "tubs" are provided around each component in the foregoing process. These tubs are typically produced by implantation or diffusion techniques, preferably with a n-conductive dopant into a p-conductive semiconductor substrate.

However, due to the absence of, for example, a diffusion-produced buried layer with the foregoing process, a high collector path impedance as well as a high collector substrate capacitance occur, the undesirable influence of which is further increased by a substantial collector base capacitance because of the absence of an epitaxial layer. Further, tubs require a specific amount of space and this prevents attainment of maximum component packing density. Yet further, adjustment of individual masking steps during this process presents problems because no self-adjusting alignment procedure appears possible.

SUMMARY OF THE INVENTION

The invention provides a process for providing semiconductor components whereby an increased packing density and increased yield is achieved over that heretofore available.

In accordance with the principles of the invention, a semiconductor substrate having a first zone of one conductivity type is provided with a structured or patterned first insulating layer, such as composed of silicon nitride, insulation grooves are then etched at the substrate areas not covered by the first insulating layer, a second insulating layer, such as composed of silicon dioxide, is grown within the etched grooves so as to be thicker than the first insulating layer and various semiconductor structures are then emplaced in a simplified procedure and without tubs between the filled insulating grooves so as to finish the semiconductor component.

In certain embodiments of the invention, the first zone of one conductivity type on the semiconductor structure is subjected to a post-diffusion during the growth of the second insulating layer and further zones of different conductivity are provided thereafter, as by diffusion or ion implantation.

DESCRIPTION OF THE PREFERRED EMBODIMENTS

The invention provides a process for producing semiconductor components whereby a relatively high packing density and increased yield are attained.

In accordance with the principles of the invention, a first insulating layer is applied onto a semiconductor substrate having a first zone of one conductivity type therein and this insulating layer is structured or patterned to cover select areas of the semiconductor substrate surface while leaving other areas thereof free of such insulating layer. Then, at least select portions of the semiconductor surface area free of the first insulating layer are etched so as to produce insulating grooves or trenches which are spaced apart from one another via the first insulating layer. Next, a second insulating layer (an insulating oxide) which is thicker than the first insulating layer, is applied at least within the insulating grooves. During the application of the second insulating layer, the first zone of one conductivity type may be subjected to a post-diffusion for enlargement thereof and further zones of different conductivity may be provided thereafter, preferably by dopant diffusion or ion implantation techniques.

With the principles of the invention, individual semiconductor components or elements require a relatively small area and because of such small area as well as the small side wall capacitance of the insulating oxide, the collector substrate and the base collector capacitance of semiconductor components produced in accordance with the principles of the invention is materially reduced. During the oxidation or growth of the second insulating layer, a post-diffusion of the first conductivity zone in the semiconductor substrate is effected so that the collector path impedance is reduced. No tubs are required with the practice of the invention so that a relatively high packing density, particularly with transistors having, for example, a diffusion produced oxide-limited emitter, are attained relative to the prior art.

After the patterning or etching of the first insulating layer, the insulation grooves or trenches are etched. These grooves are automatically adjusted with a zone of a specific conductivity type, previously provided beneath the first insulating layer. This simplifies the production procedure and further contributes to an increased yield.

In preferred embodiments of the invention, silicon nitride ($Si_3N_4$) is used to form the first insulating layer and silicon dioxide ($SiO_2$) is used to form the second insulating layer.

Figure 1:
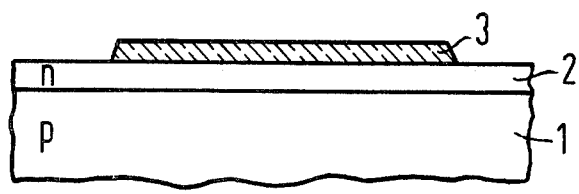
FIG. 1 is a partial, elevated and somewhat schematic view of a semiconductor substrate having an insulating layer on a n-conductive zone of such substrate and which is undergoing manufacture in accordance with the principles of the invention.
Figure 2:
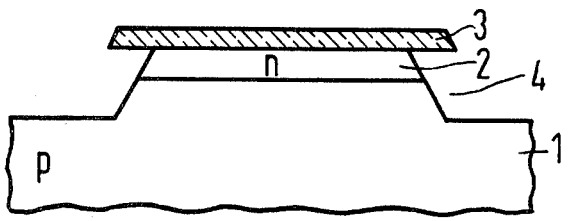
FIG. 2 is a somewhat similar view of FIG. 1 after isolating grooves are provided about the insulating layer.

Referring now to the drawings wherein like reference numerals refer to like elements, a p-conductive silicon substrate 1 having a specific resistance of about 0.5 ohm cm and a (100)-orientation is provided with a n-conductive zone 2, for example, by ion implantation of phosphorus ions with an energy of about 100 keV and at a dose of about $10^{13}$ P atoms per square centimeter. A first relatively thin insulating layer 3 composed, for example, of silicon nitride, is then applied on the surface of zone 2 and is structure-etched so as to produce a select pattern which exhibits areas covered with silicon nitride and areas free of silicon nitride, substantially as shown at FIG. 1.

Next, the surface areas of layer 2 which are free of silicon nitride are etched and the insulation grooves or trenches 4 which are thus formed are automatically self-adjusted relative to covered areas of layer 2 (compare German Offenlegungsschrift No. 2,359,511 which generally corresponds to U.S. Pat. No. 3,977,925). The insulation grooves 4 are etched to a depth of about 0.8 μm and sufficiently to penetrate through zone 2 and into the surface of the p-conductive semiconductor substrate.

If desired, a channel stopper may be implanted or diffused into the "floor" of the insulation grooves 4 as per the teachings of German Offenlegungsschrift No. 2,438,256 which generally corresponds to U.S. Pat. No. 4,014,714.

Figure 3:
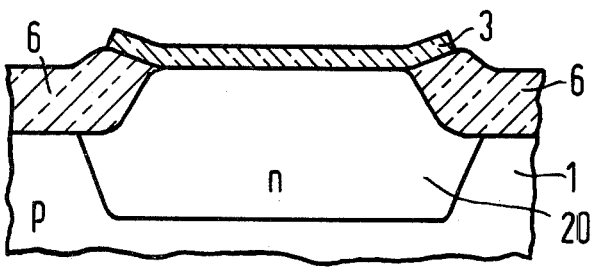
FIG. 3 is a similar view of FIG. 2 after an oxide isolation layer is grown within the grooves and enlargement of the n-conductive zone occurs.

Thereafter, a second insulating layer 6 composed of, for example, silicon dioxide, is formed so as to at least fill the insulating grooves 4. The insulation layer 6 is relatively thick in comparison to the first insulating layer 3 and preferably is formed so as to have a thickness of about 1.5 μm (accordingly, the first insulating layer is relatively thin in comparison to the second insulating layer). During the application or growth of this insulating oxide layer, a post-diffusion of zone 2 may occur in order to enlarge such zone into an n-conductive zone 20 within the substrate 1. At the peripheral edges of the insulating grooves or trenches 4, the insulation layer 6 is made thicker than the other portions thereof so as to curve the outer edges of the first insulating layer 3 somewhat upward, as schematically shown at FIG. 3.

Figure 4:
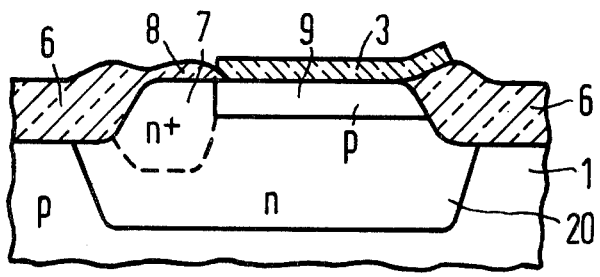
FIG. 4 is a similar view of FIG. 3 after a conductive region and a base region are provided within the n-conductive zone.
Figure 5:
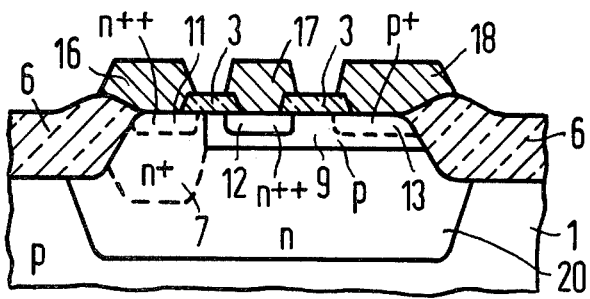
FIG. 5 is a similar view of FIG. 4 after terminal zones are provided within the conductive region and the base region and electrodes are applied to such terminal zones.

Then, by conventional masking techniques, a select portion of the first insulating layer 3 is removed and a n+conductive zone 7 is diffused into the so-uncovered substrate surface. Zone 7 functions as a collector terminal zone for the underlying zone 20. During this diffusion process, a relatively thin silicon dioxide layer 8 is formed on the previously uncovered substrate surface. Next, a base zone 9 is implanted into the area bounded by zone 7 and a spaced insulating groove 6 (see FIG. 4). The base zone 9 is formed so as to have a layer resistance of about 500 ohm per square. The implantation of base zone 9 may, if desired, be effected through the first insulating layer 3. After a further diffusion of n++-conductive terminal zones 11 and 12 as well as a small p+-conductive terminal zone 13 in a conventional manner, metal electrodes 16, 17 and 18 for the collector, emitter and base may be respectively applied. These terminal zones, 11, 12 and 13, may possess a bulk or sheet resistance of about 60 ohms per square.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. A process for producing a semiconductor component consisting essentially of the sequential steps of:
   providing a semiconductor substrate of one conductivity type;
   forming a first zone onto a first surface of said substrate, said first zone having a conductivity type different from that of said substrate;
   applying a relatively thin layer of silicon nitride onto said first zone and etching a desired pattern thereon so that some areas of said first zone are uncovered;
   etching at least the uncovered areas of the first zone to a depth sufficient to penetrate said first zone and form a second surface within said substrate below said first surface of the substrate and to form adjacent first zone side walls;
   substantially simultaneously forming a relatively thick layer of silicon dioxide on at least the second surface of the substrate and on first zone side walls and post-diffusing said first zone so as to enlarge said first zone;
   forming other space-apart zones within said first zone, said other zones having a conductivity type different from that of said first zone; and
   providing electrodes for said spaced-apart zones.

2. A process as defined in claim 1 wherein after the silicon dioxide layer is formed, a select area of the silicon nitride layer is removed, a second zone of a conductivity type different from that of the first zone is formed within the so-uncovered area above said first zone and a zone of a conductivity type different from that of said first and second zone is formed adjacent said second zone and above said first zone.

3. In a process as defined in claim 1 wherein said first zone is formed by diffusion.

4. In a process as defined in claim 1 wherein said first zone is formed by ion implantation.

5. In a process as defined in claim 1 wherein the select areas of the substrate surface free of the first insulating layer are etched to a depth of about 0.8 μm.

6. In a process as defined in claim 5 wherein the second insulating layer is formed so as to have a thickness of about 1.5 μm.

7. In a process as defined in claim 6 wherein said first zone is subjected to a post-diffusion during the formation of the second insulating layer.

8. In a process as defined in claim 7 wherein said other zones are formed by diffusion.

9. In a process as defined in claim 7 wherein at least some of said other zones are formed by ion implantation.

* * * * *